(12) United States Patent
Park et al.

(10) Patent No.: US 10,236,310 B2
(45) Date of Patent: Mar. 19, 2019

(54) TRANSISTOR SUBSTRATE, AND ORGANIC LIGHT EMITTING DISPLAY PANEL INCLUDING THE SAME HAVING A COUPLED DRIVING GATE AND SWITCHING CHANNEL

(71) Applicant: LG Display Co., Ltd., Seoul (KR)

(72) Inventors: SeHee Park, Bucheon-si (KR); HongRak Choi, Paju-si (KR); PilSang Yun, Bucheon-si (KR); HyungJoon Koo, Paju-si (KR); Kwanghwan Ji, Bucheon-si (KR); Jaeyoon Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/824,974

(22) Filed: Nov. 28, 2017

(65) Prior Publication Data

US 2018/0151606 A1 May 31, 2018

(30) Foreign Application Priority Data

Nov. 30, 2016 (KR) ......................... 10-2016-0162347

(51) Int. Cl.
| | |
|---|---|
| *H01L 27/12* | (2006.01) |
| *H01L 27/32* | (2006.01) |
| *H01L 29/49* | (2006.01) |
| *H01L 29/78* | (2006.01) |
| *H01L 51/56* | (2006.01) |
| *H01L 29/417* | (2006.01) |

(Continued)

(52) U.S. Cl.
CPC ...... *H01L 27/1288* (2013.01); *H01L 27/0733* (2013.01); *H01L 27/1225* (2013.01); *H01L 27/1237* (2013.01); *H01L 27/1248* (2013.01); *H01L 27/1255* (2013.01); *H01L 27/3246* (2013.01); *H01L 27/3248* (2013.01); *H01L 27/3258* (2013.01); *H01L 27/3262* (2013.01); *H01L 29/41733* (2013.01); *H01L 29/4908* (2013.01); *H01L 51/56* (2013.01); *H01L 27/1214* (2013.01); *H01L 29/78645* (2013.01); *H01L 29/78696* (2013.01); *H01L 2924/1426* (2013.01)

(58) Field of Classification Search
CPC ............. H01L 27/1288; H01L 27/1248; H01L 27/1255; H01L 27/3246; H01L 27/3248; H01L 27/3258; H01L 27/3262; H01L 27/1214; H01L 29/4908; H01L 29/78696; H01L 29/78645; H01L 51/56; H01L 2924/1426

See application file for complete search history.

(56) References Cited

U.S. PATENT DOCUMENTS 9,147,719 B2 * 9/2015 Kim ...................... H01L 27/326
9,349,781 B2 * 5/2016 Park .................... H01L 27/3262
(Continued)

*Primary Examiner* — Ida M Soward
(74) *Attorney, Agent, or Firm* — Polsinelli PC

(57) ABSTRACT

Disclosed are a transistor substrate, an organic light emitting display panel including the same, a method of manufacturing the transistor substrate, and an organic light emitting display device including the organic light emitting display panel, in which a driving transistor and a switching transistor are provided and each include an oxide semiconductor of which both ends are covered by an insulation layer, and a gate of the driving transistor and a gate of the switching transistor are provided on different layers.

20 Claims, 13 Drawing Sheets

(51) Int. Cl.
*H01L 27/07* (2006.01)
*H01L 29/786* (2006.01)

(56) References Cited

U.S. PATENT DOCUMENTS

| | | | | |
|---|---|---|---|---|
| 9,390,655 | B2* | 7/2016 | Jeong | H01L 27/3276 |
| 9,412,297 | B2* | 8/2016 | Kim | H01L 27/124 |
| 9,412,303 | B2* | 8/2016 | Kim | G09G 3/3258 |
| 9,412,876 | B2* | 8/2016 | Koezuka | H01L 29/78693 |
| 9,564,478 | B2* | 2/2017 | Chang | H01L 27/3262 |
| 9,786,224 | B2* | 10/2017 | Kim | G09G 3/2011 |
| 2014/0158995 | A1 | 6/2014 | Park | |
| 2014/0332768 | A1 | 11/2014 | Kwon et al. | |
| 2015/0108438 | A1* | 4/2015 | Kim | H01L 27/3258 257/40 |
| 2016/0005803 | A1* | 1/2016 | Ryu | H01L 27/3248 257/40 |
| 2016/0254282 | A1* | 9/2016 | Lv | H01L 21/77 257/43 |
| 2016/0322453 | A1* | 11/2016 | Park | H01L 27/3279 |
| 2018/0033805 | A1* | 2/2018 | Gupta | H01L 27/1255 |

* cited by examiner

TRANSISTOR SUBSTRATE, AND ORGANIC LIGHT EMITTING DISPLAY PANEL INCLUDING THE SAME HAVING A COUPLED DRIVING GATE AND SWITCHING CHANNEL

CROSS-REFERENCE TO RELATED APPLICATION

This application claims the benefit of the Korean Patent Application No. 10-2016-0162347 filed on Nov. 30, 2016, which is hereby incorporated by reference in its entirety for all purposes as if fully set forth herein.

BACKGROUND

Field of the Disclosure

The present disclosure relates to a display device, and more particularly, to a transistor substrate, an organic light emitting display panel including the same, and a method of manufacturing the transistor substrate.

Description of the Background

Flat panel display (FPD) devices have been applied to various kinds of electronic products such as portable phones, tablet personal computers (PCs), notebook PCs, etc. Examples of the FPD devices (hereinafter, referred to as a display device) include liquid crystal display (LCD) devices, organic light emitting diode (OLED) display devices, etc. Recently, electrophoretic display devices (EPDs) are being widely used as a type of FPD device.

As a type of FPD device (hereinafter referred to as a display device), organic light emitting display devices have a fast response time of 1 ms or less and a low consumption power, and thus, are attracting much attention as next generation display devices.

FIG. 1 is a cross-sectional view of the related art organic light emitting display panel, and FIG. 2 is a graph showing a relationship between a current and a gate-source voltage of a driving transistor of the related art organic light emitting display panel. FIG. 3 is illustrating a process of manufacturing a thin film transistor (TFT) included in the related art organic light emitting display panel, and particularly, is illustrating a method of forming an active part 13 of a switching transistor Tsw.

The related art organic light emitting display panel, as illustrated in FIG. 1, includes a switching transistor Tsw connected to a gate line and a data line, an organic light emitting diode (OLED) 30 including an anode 31, a light emitting layer 32, and a cathode 33, and a driving transistor Tdr connected to the anode 31 and the switching transistor Tsw. A second electrode 16 of the switching transistor Tsw is connected to the data line, a first electrode 17 of the switching transistor Tsw is connected to a gate 21 of the driving transistor Tdr, and a gate 15 of the switching transistor Tsw is connected to the gate line. In order to increase a storage capacitance between the gate 21 of the driving transistor Tdr and the anode 31, in the related art organic light emitting display panel, a thickness of a gate insulation layer 14 or an insulation layer 19 is formed to be thin. Also, in the related art, as illustrated in FIG. 1, a metal layer 51 is used for increasing the storage capacitance.

More specifically, a first capacitance Ca is generated between the first electrode 17 of the switching transistor Tsw and a capacitance electrode 41 connected to the anode 31, and a second capacitance Cb is generated between the first electrode 17 and the metal layer 51. The first capacitance Ca and the second capacitance Cb constitute the storage capacitance. In FIG. 1, two capacitance electrodes referred to by reference numeral 41 are separated from each other in the drawing, but they are electrically connected to each other.

In order to enhance a characteristic of the switching transistor Tsw, a thickness of the gate insulation layer 14 needs to be reduced. However, if the thickness of the gate insulation layer 14 is reduced, a characteristic of the driving transistor Tdr can be degraded.

For example, in order to enhance the characteristic of the switching transistor Tsw, if the thickness of the gate insulation layer 14 is formed to be thin, a width "ΔVgs" of a period where the driving transistor Tdr is turned on and thus a current increases becomes significantly narrowed (or small), as shown in FIG. 2.

The width "ΔVgs" being narrowed denotes that a width of a voltage representing a gray level of a color is narrowed. For example, when voltages corresponding to the width "ΔVgs" are divided into 256 voltages, 256 colors can be realized.

Therefore, there is a limitation in forming a minimum thickness of the thickness of the gate insulation layer 14.

Moreover, in order to increase the storage capacitance, as illustrated in FIG. 1, the related art organic light emitting display panel including the capacitance electrode 41 and the metal layer 51 additionally needs a mask for forming the capacitance electrode 41 and the metal layer 51. Also, an area of the capacitance electrode 41 is reduced by contact holes, causing the reduction in level of the storage capacitance.

Moreover, as illustrated in FIGS. 3A and 3B, since the active part 13 of the switching transistor Tsw and an active part 22 of the driving transistor Tdr are formed by etching an insulating material 14a, particles can flow in when a process of etching the insulating material 14a is performed, thereby causing a defect.

For example, as illustrated in FIG. 3A, in order to manufacture the switching transistor Tsw, a buffer 12 is deposited on a substrate 11, an oxide semiconductor 13 is formed on the buffer 12, an insulating material 14a is deposited on the oxide semiconductor 13, and the gate 15 is formed on the insulating material 14a.

When the insulating material 14a is etched by using the gate 15 as a mask, as illustrated in FIG. 3 (b), the gate insulation layer 14 is formed, and a portion of the oxide semiconductor 13 is exposed to the outside.

When plasma is applied to the exposed oxide semiconductor 13, as illustrated in FIG. 3B, an exposed area becomes conductive, and thus, the first electrode 17 and the second electrode 16 of the switching transistor Tsw are formed. The driving transistor Tdr is also formed through the same process as the switching transistor Tsw.

However, since the insulating material 14a is etched through a dry etching process in order to form the first electrode 17 and the second electrode 16, the buffer 12 is etched in the dry etching process, and for this reason, a step height A can occur between the oxide semiconductor 13 and the buffer 12. Due to the step height A, a short circuit can occur in the lines connected to the first electrode 17 and the second electrode 16.

SUMMARY

Accordingly, the present disclosure is directed to provide a transistor substrate, an organic light emitting display panel including the same, a method of manufacturing the transistor substrate, and an organic light emitting display device including the organic light emitting display panel that substantially obviate one or more problems due to limitations and disadvantages of the related art.

An aspect of the present disclosure is directed to provide a transistor substrate, an organic light emitting display panel including the same, a method of manufacturing the transistor substrate, and an organic light emitting display device including the organic light emitting display panel, in which a driving transistor and a switching transistor are provided and each include an oxide semiconductor of which both ends are covered by an insulation layer, and a gate of the driving transistor and a gate of the switching transistor are provided on different layers.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a transistor substrate including a substrate, a switching channel provided on the substrate, a driving channel provided on the substrate, a gate insulation layer covering the switching channel and the driving channel, a switching gate provided on the gate insulation layer to overlap a switching active part which includes an oxide semiconductor and configures the switching channel, a first insulation layer covering the switching gate and the gate insulation layer, a driving gate provided on the first insulation layer to overlap a driving active part which includes an oxide semiconductor and configures the driving channel, a second insulation layer covering the driving gate and the first insulation layer, a first electrode provided on the second insulation layer and connected to a first conductor part configuring the switching channel and the driving gate, and a second electrode provided on the second insulation layer and connected to a second conductor part configuring the switching channel.

In another aspect of the present disclosure, there is provided an organic light emitting display panel including the transistor substrate, a passivation layer covering the first electrode, the second electrode, and the second insulation layer, and an organic light emitting diode (OLED) provided on the passivation layer, wherein an anode configuring the OLED is connected to the third conductor part of the driving channel.

In another aspect of the present disclosure, there is provided an organic light emitting display device including the organic light emitting display panel, a gate driver supplying a gate pulse to a plurality of gate lines included in the organic light emitting display panel, a data driver supplying data voltages to a plurality of data lines included in the organic light emitting display panel, and a controller controlling the gate driver and the data driver.

In another aspect of the present disclosure, there is provided a method of manufacturing a transistor substrate including depositing a switching channel on a substrate, depositing a driving channel on the substrate, depositing a gate insulation layer to cover the switching channel and the driving channel, depositing a switching gate on the gate insulation layer to overlap a switching active part which includes an oxide semiconductor and configures the switching channel, depositing a first insulation layer to cover the switching gate and the gate insulation layer, depositing a driving gate on the first insulation layer to overlap a driving active part which includes an oxide semiconductor and configures the driving channel, depositing a second insulation layer to cover the driving gate and the first insulation layer, and depositing a first electrode and a second electrode on the second insulation layer, the first electrode being connected to a first conductor part configuring the switching channel and the driving gate, and the second electrode being connected to a second conductor part configuring the switching channel.

In another aspect of the present disclosure, there is provided an organic light emitting display panel comprising a substrate; a switching channel on the substrate; a driving channel on the substrate; a gate insulation layer covering the switching channel and the driving channel; a switching gate on the gate insulation layer and overlapping a switching active part which includes an oxide semiconductor and constitutes the switching channel; a first insulation layer covering the switching gate and the gate insulation layer; a driving gate on the first insulation layer and overlapping a driving active part which includes an oxide semiconductor and constitutes the driving channel; a second insulation layer covering the driving gate and the first insulation layer; a first electrode on the second insulation layer and connected to the driving gate and the switching channel through a first conductor part; a second electrode on the second insulation layer and connected to the switching channel through a second conductor part; a passivation layer covering the first electrode, the second electrode, and the second insulation layer; and an organic light emitting diode (OLED) disposed on the passivation layer having an anode connected to the third conductor part of the driving channel.

In a further aspect of the present disclosure, there is provided a method of manufacturing a thin film transistor substrate, the method comprising forming a buffer layer on a substrate; forming a channel on the buffer layer; forming a gate insulation layer on the channel including the buffer layer; forming a gate overlapping a center portion of the channel on the gate insulation layer; irradiating UV on the channel through the gate insulation layer by using the gate as a mask to form first and second metal layers on both side portions of the channel unexposed by the UV irradiation; and forming a first insulation layer the gate including the gate insulation layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
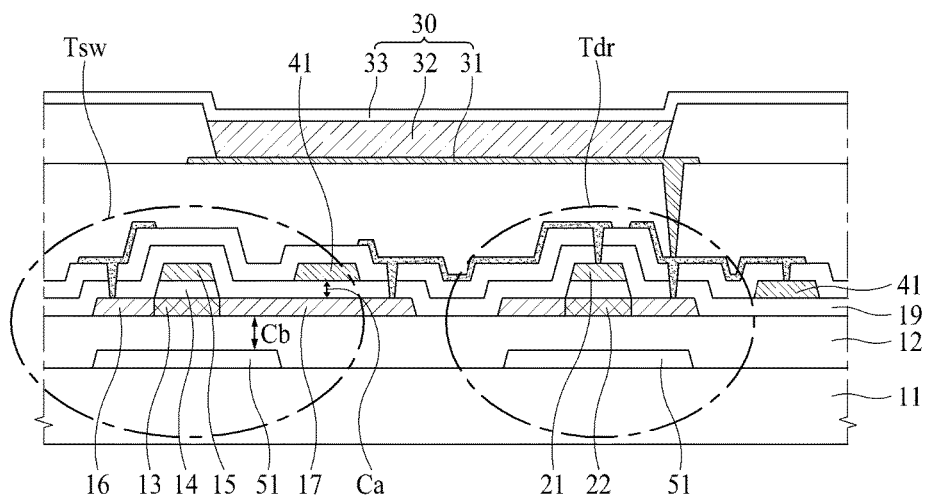
FIG. 1 illustrates a cross-sectional view of the related art organic light emitting display panel.
Figure 2:
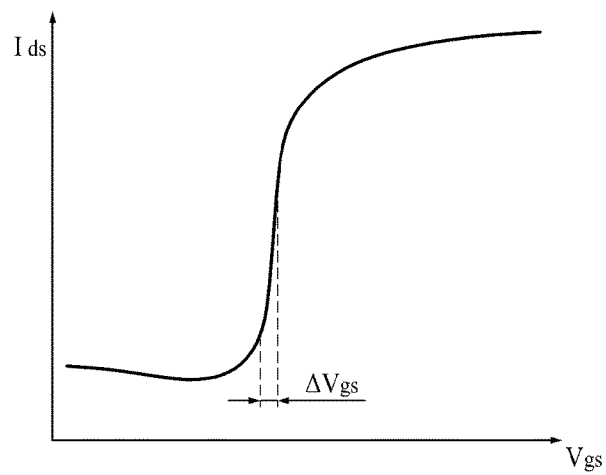
FIG. 2 is a graph showing a relationship between a current and a gate-source voltage of a driving transistor of the related art organic light emitting display panel.
Figure 3A:
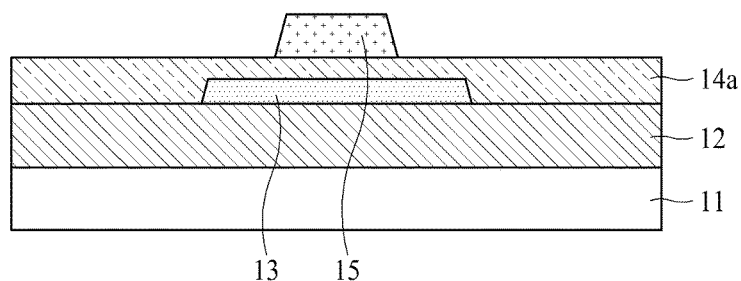
FIGS. 3A and 3B illustrate a process of manufacturing a thin film transistor (TFT) included in the related art organic light emitting display panel.
Figure 3B:
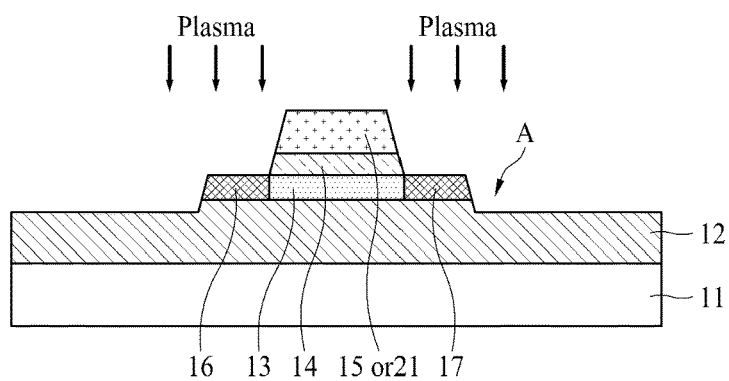

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

Figure 4:
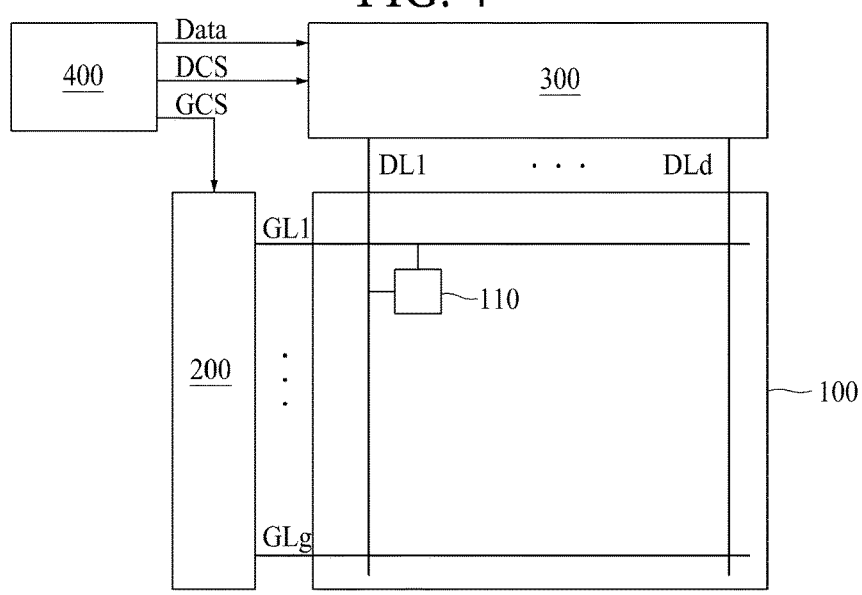
FIG. 4 is a schematic diagram illustrating a configuration of an organic light emitting display device according to an aspect of the present disclosure.
Figure 5:
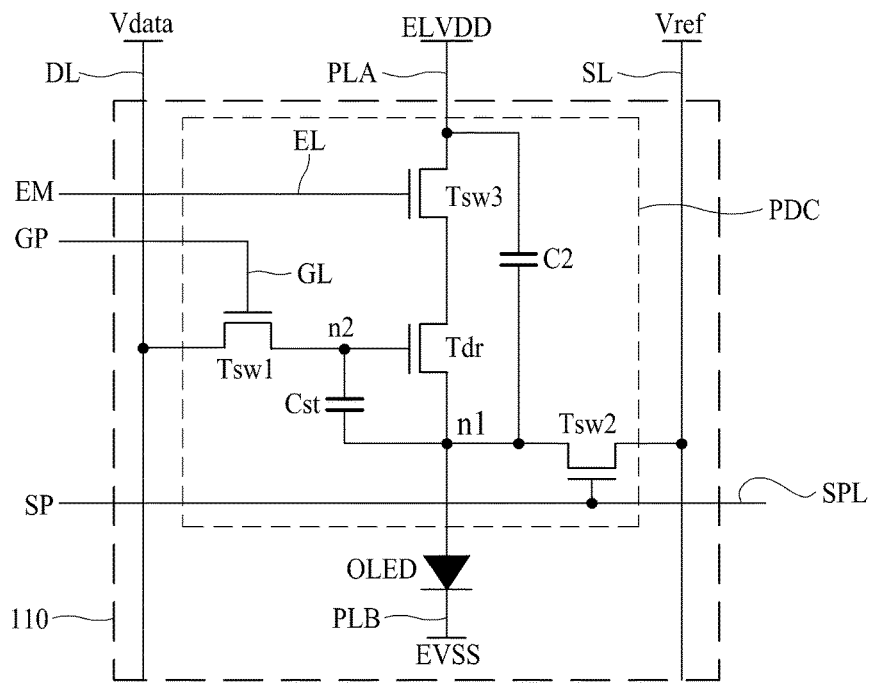
FIG. 5 is a circuit diagram illustrating a configuration of a pixel included in an organic light emitting display panel according to an aspect of the present disclosure.

FIG. 4 illustrates a configuration of an organic light emitting display device according to an aspect of the present disclosure, and FIG. 5 is a circuit diagram illustrating a configuration of a pixel included in an organic light emitting display panel according to an aspect of the present disclosure.

The organic light emitting display device according to an aspect of the present disclosure, as illustrated in FIG. 4, may include an organic light emitting display panel 100 where a plurality of pixels 110 defined by a plurality of gate lines GL1 to GLg and a plurality of data lines DL1 to DLd are provided to display an image, a gate driver 200 which sequentially supplies a gate pulse to the gate lines GL1 to GLg included in the organic light emitting display panel 100, a data driver 300 which respectively supplies data voltages to the data lines DL1 to DLd included in the organic light emitting display panel 100, and a controller 400 which controls the gate driver 200 and the data driver 300.

The organic light emitting display panel 100 may include the gate lines GL1 to GLg through which the gate pulse is supplied, the data lines DL1 to DLd through which the data voltages are supplied, and the pixels 110 defined by the gate lines GL1 to GLg and the data lines DL1 to DLd. Each of the pixels 110 may include at least one coplanar oxide thin film transistor (hereinafter referred to as a transistor). A structure of the transistor will be described in detail with reference to FIGS. 6 to 21.

Each of the pixels 110 included in the organic light emitting display panel 100, as illustrated in FIG. 5, may include an organic light emitting diode OLED which emits light and a pixel driver PDC which drives the organic light emitting diode OLED. A plurality of signal lines DL, EL, GL, PLA, PLB, SL, and SPL for supplying a driving signal to the pixel driver PDC may be provided in each of the pixels 110.

A data voltage Vdata may be supplied through a data line DL, a gate pulse GP may be supplied through a gate line GL, a first driving power ELVDD may be supplied through a power supply line PLA, a second driving power EVSS may be supplied through a driving power line PLB, a reference voltage Vref may be supplied through a sensing line SL, a sensing pulse SP for turning on/off a sensing transistor Tsw2 may be supplied through a sensing pulse line SPL, and an emission control signal EM for driving an emission transistor Tsw3 may be supplied through an emission line EL.

For example, as illustrated in FIG. 5, the pixel driver PDC may include a switching transistor Tsw1 which is connected to the gate line GL and the data line DL, a driving transistor Tdr which controls a level of a current output from the organic light emitting diode OLED according to the data voltage Vdata transferred through the switching transistor Tsw1, the sensing transistor Tsw2 which senses a characteristic of the driving transistor Tdr, and the emission transistor Tsw3 which controls an emission timing of the driving transistor Tdr.

A storage capacitance Cst may be provided between a gate of the driving transistor Tdr and an anode of the organic light emitting diode OLED. The storage capacitance Cst may be referred to as a first capacitance.

A second capacitance C2 may be provided between the anode of the organic light emitting diode OLED and a terminal, supplied with the first driving power ELVDD, of terminals of the emission transistor Tsw3.

The switching transistor Tsw1 may be turned on by the gate pulse GP supplied through the gate line GL and may transfer the data voltage Vdata, supplied through the data line DL, to the gate of the driving transistor Tdr.

The sensing transistor Tsw2 may be connected to the sensing line SL and a first node n1 between the driving transistor Tdr and the organic light emitting diode OLED and may be turned on/off by the sensing pulse SP. In a sensing period, the sensing transistor Tsw2 may sense the characteristic of the driving transistor Tdr.

A second node n2 connected to the gate of the driving transistor Tdr may be connected to the switching transistor Tsw1. The storage capacitance Cst may be provided between the second node n2 and the first node n1. As the storage capacitance Cst increases, a driving characteristic of the driving transistor Tdr is enhanced.

The emission transistor Tsw3 may transfer the first driving power ELVDD to the driving transistor Tdr or may cut off the first driving power EVDD, based on the emission control signal EM. When the emission transistor Tsw3 is turned on, a current may be supplied to the driving transistor Tdr, and thus, light may be emitted from the organic light emitting diode OLED.

In addition to a structure illustrated in FIG. 5, the pixel driver PDC may be configured in various structures.

Each of the transistors included in the pixel driver PDC may be an oxide thin film transistor (TFT).

The transistors may be provided in a non-display area outside a display area where the pixels are provided. For example, when the gate driver 200 is built into the non-display area of the organic light emitting display panel 100, each of transistors configuring the gate driver 200 may also be an oxide TFT.

Therefore, all transistors included in the organic light emitting display panel may be formed through the same process.

Subsequently, the controller 400 may output a gate control signal GCS for controlling the gate driver 200 and a data control signal DCS for controlling the data driver 300, based on a timing signal (for example, a vertical sync signal, a horizontal sync signal, a clock, etc.) supplied from an external system. The controller 400 may sample input video data received from the external system and may realign the sampled video data to supply digital image data Data, obtained through the realignment, to the data driver 300.

Thereafter, the data driver 300 may convert the image data Data input from the controller 400 into analog data voltages Vdata and may transfer the data voltages Vdata for one horizontal line to the data lines DL1 to DLd at every one horizontal period where the gate pulse GP is supplied to one gate line GL.

Finally, the gate driver 200 may sequentially supply the gate pulse to the gate lines GL1 to GLg of the organic light emitting display panel 100 in response to the gate control signal GCS input from the controller 400. Therefore, transistors included in each of pixels 110 supplied with the gate pulse may be turned on, and each of the pixels 110 may display an image. The gate driver 200 may be provided independently from the organic light emitting display panel 100 and may be electrically connected to the organic light emitting display panel 100 in various types, but is not limited thereto. In other aspects, the gate driver 200 may be provided as a gate-in panel (GIP) type which is built into the organic light emitting display panel 100.

Hereinabove, each of the data driver 300, the gate driver 200, and the controller 400 has been described as being independently provided. However, at least one of the data driver 300 and the gate driver 200 may be configured as one body with the controller 400.

Figure 6:
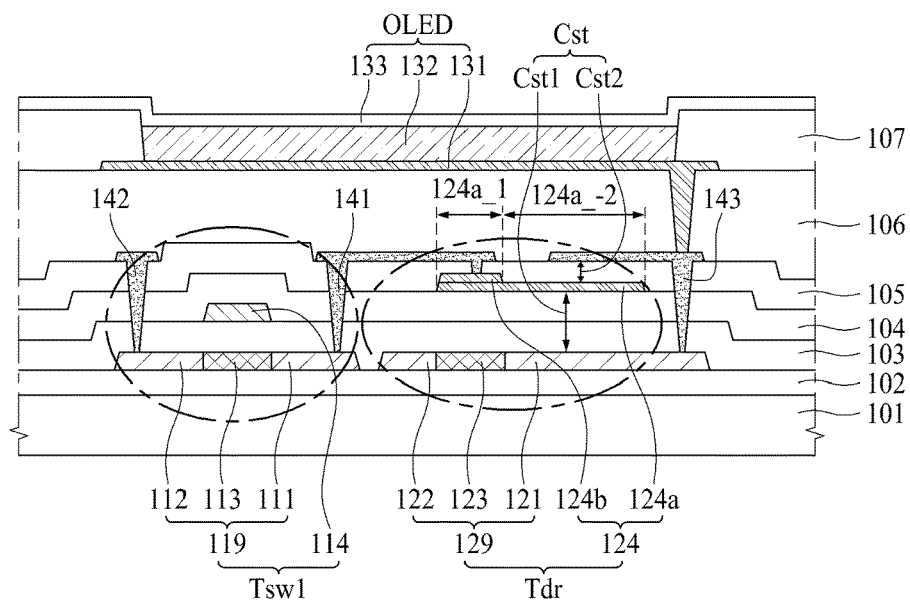
FIG. 6 illustrates a cross-sectional view of a pixel of an organic light emitting display panel according to an aspect of the present disclosure.

FIG. 6 illustrates a cross-sectional view of a pixel of an organic light emitting display panel 100 according to an aspect of the present disclosure.

The organic light emitting display panel 100 according to an aspect of the present disclosure, as illustrated in FIG. 6, may include a substrate 101, a switching channel 119, a driving channel 129, a gate insulation layer 103, a switching gate 114, a first insulation layer 104, a driving gate 124, a second insulation layer 105, a first electrode 141, a second electrode 142, a third electrode 143, a passivation layer 106, and an organic light emitting diode OLED. In the below-described organic light emitting display panel 100 according to an aspect of the present disclosure, except for the passivation layer 106 and the organic light emitting diode OLED, a transistor substrate according to an aspect of the present disclosure may be provided. That is, the transistor substrate according to an aspect of the present disclosure may include the substrate 101, the switching channel 119, the driving channel 129, the gate insulation layer 103, the switching gate 114, the first insulation layer 104, the driving gate 124, the second insulation layer 105, the first electrode 141, the second electrode 142, and the third electrode 143 among the elements illustrated in FIG. 6. Therefore, the transistor substrate according to an aspect of the present disclosure is not separately described.

The substrate 101 may be a glass substrate, a plastic substrate, or the like.

Before the switching channel 119 and the driving channel 129 is provided, a buffer 102 may be provided on the substrate 101. The buffer 102 may be formed of an organic material, an inorganic material, and/or the like.

The switching channel 119 may be provided on the substrate 101 or the buffer 102. The switching channel 119 may include a switching active part 113 formed of an oxide semiconductor and first and second conductor parts 111 and 112 which are formed by irradiating ultraviolet (UV) on the oxide semiconductor. The driving channel 129 may be provided on the substrate 101 or the buffer 102. The driving channel 129 may include a driving active part 123 formed of an oxide semiconductor and third and fourth conductor parts 121 and 122 which are formed by irradiating UV on the oxide semiconductor.

The gate insulation layer 103 may cover the switching channel 119 and the driving channel 129. The gate insulation layer 103 may be formed of an organic material, an inorganic material, and/or the like.

Particularly, the gate insulation layer 103 may be deposited on a front surface of the substrate 101 to cover the switching channel 119 and the driving channel 129.

In a process of manufacturing the organic light emitting display panel, by using the switching gate 114 and the driving gate 124 as a mask, UV may be irradiated on the switching channel 119 and the driving channel 129 in a state where the gate insulation layer 103 covers the switching channel 119 and the driving channel 129.

Before UV is irradiated, an area corresponding to each of the first and second conductor parts 111 and 112 included in the switching channel 119 and the third and fourth conductor parts 121 and 122 included in the driving channel 129 may be an oxide semiconductor like the switching active part 113 and the driving active part 123.

However, if UV is irradiated, carriers are increased in an area, uncovered by the switching gate 114 of the switching channel 119 and an area, uncovered by the driving gate 124 of the driving channel 129. Therefore, a resistance is decreased in the areas, and thus, the first to fourth conductor parts 111, 112, 121, and 122 can have a characteristic of metal. Such a feature will be described in detail with reference to FIGS. 13 to 19.

The switching gate 114 may be provided on the gate insulation layer 103 to overlap the switching active part 113 constituting the switching channel 119. The switching active part 113 may be formed of an oxide semiconductor.

The first insulation layer 104 may cover the switching gate 114 and the gate insulation layer 103. The first insulation layer 104 may be formed of an organic material, an inorganic material, and/or the like.

The driving gate 124 may be provided on the first insulation layer 104 to overlap the driving active part 123 constituting the driving channel 129. The driving active part 123 may be formed of an oxide semiconductor.

Particularly, as illustrated in FIG. 6, the driving gate 124 may be configured with two layers overlapping each other, and for example, may include a first gate electrode 124a and a second gate electrode 124b.

The first gate electrode 124a may be provided on the first insulation layer 104. The first gate electrode 124a may be disposed to overlap the third conductor part 121 and the driving active part 123 of the driving channel 129. The first gate electrode 124a may be formed of a transparent conductive material, for example, indium tin oxide (ITO), indium zinc oxide (IZO), or the like.

The second gate electrode 124b may be provided on the first gate electrode 124a. The second gate electrode 124b may be disposed to overlap the driving active part 123. The second gate electrode 124b may be connected to the first electrode 141.

The second gate electrode 124b may be formed of an opaque metal for blocking UV. For example, the second gate electrode 124b may be formed of copper. Therefore, in a case where UV is irradiated on the driving channel 129 so as to form the third and fourth conductor parts 121 and 122, the second gate electrode 124b may function as a mask.

In this case, since the first gate electrode 124a is formed of a transparent conductive material, UV may pass through the first gate electrode 124a.

Therefore, UV may be irradiated on areas, uncovered by the second gate electrode 124b, of the driving channel 129, and thus, carriers are increased in an oxide semiconductor provided in the areas, whereby the areas may have a characteristic of a conductor. Accordingly, the UV-irradiated areas may correspond to the third conductor part 121 and the fourth conductor part 122. The third conductor part 121 and the fourth conductor part 122 may be respectively provided in both ends of the driving active part 123 which has a characteristic of a semiconductor because the driving active part 123 is covered by the second gate electrode 124b and thus UV is not irradiated on the driving active part 123.

The first gate electrode 124a may form the storage capacitance Cst along with the third conductor part 121 constituting the driving channel 129. The storage capacitance Cst provided between the first gate electrode 124a and the third conductor part 121 configuring the driving channel 129 may be referred to as a first storage capacitance Cst1.

As an area of the first gate electrode 124a increases, a level of the first storage capacitance Cst1 may increase, thereby improving a characteristic of the driving transistor Tdr.

Moreover, the storage capacitance Cst necessary for driving of the driving transistor Tdr may be formed by adjusting an area of the first gate electrode 124a, and thus, a metal layer for additionally forming a capacitance may not be needed.

Moreover, in order to secure the storage capacitance Cst necessary for driving of the driving transistor Tdr, it is not required to excessively decrease a thickness of the gate insulation layer 103 and a thickness of the first insulation layer 104.

The first gate electrode 124a may include a first area 124a_1 overlapping the second gate electrode 124b and a second area 124a_2 overlapping the third conductor part 121.

The first gate electrode 124a may contact the second gate electrode 124b. The second insulation layer 105 may cover the driving gate 124 and the first insulation layer 104. The second insulation layer 105 may be formed of an organic material, an inorganic material, and/or the like.

A third electrode 143 connected to the third conductor part 121 of the driving channel 129 may be provided on the second insulation layer 105. An anode 131 constituting the organic light emitting diode OLED may be connected to the third electrode 143.

The first electrode 141 may be provided on the second insulation layer 105. The first electrode 141 may be connected to the first conductor part 111 of the switching channel 119 and the driving gate 124.

The first electrode 141 may be formed of various kinds of metal layers.

The second electrode 142 may be provided on the second insulation layer 105. The second electrode 142 may be connected to the second conductor part 112 of the switching channel 119. The second electrode 142 may be connected to a data line.

The third electrode 143, as illustrated in FIG. 6, may be formed to overlap the third conductor part 121 of the driving channel 129.

The storage capacitance may be formed by the driving gate 124 and the third electrode 143 overlapping the driving gate 124. The storage capacitance formed between the third electrode 143 and the driving gate 124 may be referred to as a second storage capacitance Cst2. The storage capacitance Cst may be formed by at least one of the first storage capacitance Cst1 and the second storage capacitance Cst2.

The passivation layer 106 may cover the first electrode 141, the second electrode 142, the third electrode 143, and the second insulation layer 105. The passivation layer 106 may be formed of at least one layer including an organic material or an inorganic material. The passivation layer 106 may planarize upper ends of the first electrode 141, the second electrode 142, the third electrode 143, and the second insulation layer 105.

The organic light emitting diode OLED may be provided on the passivation layer 106. The organic light emitting diode OLED may include the anode 131, a light emitting layer 132, and a cathode 133. The anode 131 of the organic light emitting diode OLED may be connected to the third conductor part 121 of the driving channel 129.

The organic light emitting diode OLED may be surrounded by the bank 107. Each of a plurality of pixels may be defined by the bank 107.

FIGS. 7 to 11 are exemplary diagrams for illustrating a method of manufacturing an organic light emitting display panel according to an aspect of the present disclosure. More specifically, FIGS. 7A to 11A illustrate a plan view of a pixel of the organic light emitting display panel, and FIG. 7B to 11B illustrate a cross-sectional view of a pixel of the organic light emitting display panel. In the following description, details which are the same as or similar to the details described above with reference to FIGS. 4 to 6 are omitted or will be briefly described.

In the below-described method of manufacturing the organic light emitting display panel, a method of manufacturing a transistor substrate according to an aspect of the present disclosure may be implemented except for a process of forming the passivation layer 106 and the organic light emitting diode OLED. Thus, the method of manufacturing the transistor substrate according to an aspect of the present disclosure is not separately described.

Figure 7A:
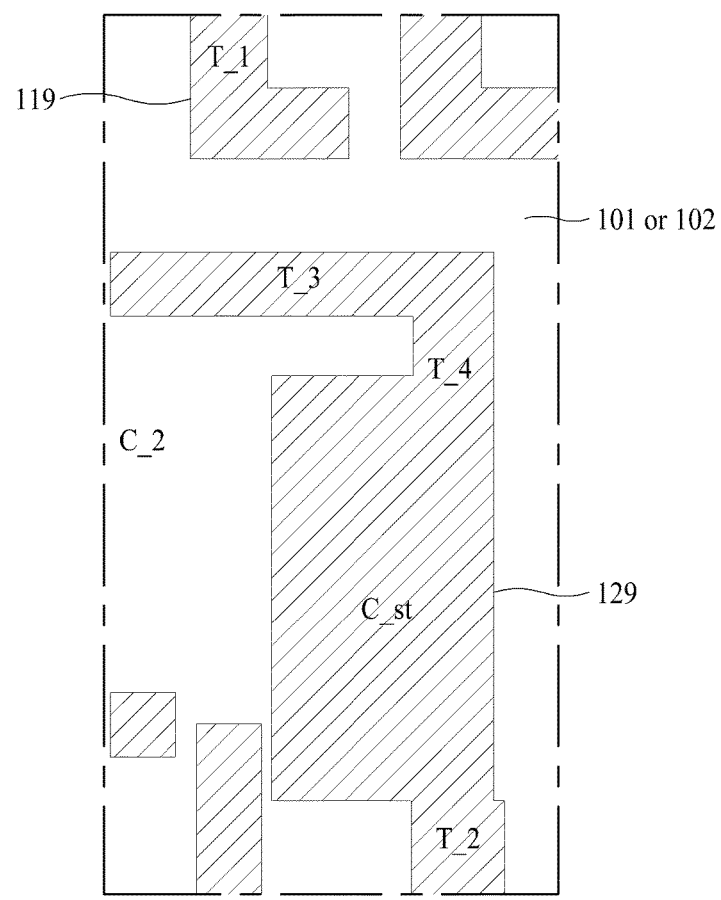
FIGS. 7A to 11B illustrate a method of manufacturing an organic light emitting display panel according to an aspect of the present disclosure.
Figure 7B:
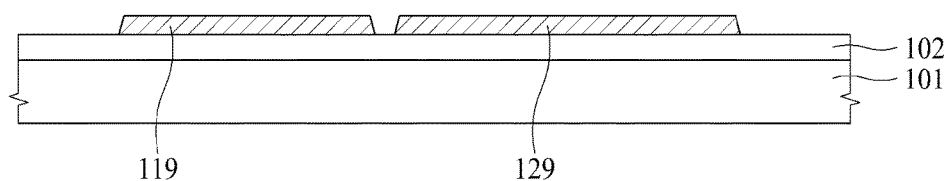

First, as illustrated in FIG. 7, by using a first mask, the switching channel 119 and the driving channel 129 each including an oxide semiconductor may be formed on the substrate 101 or the buffer 102. In FIG. 7A, in addition to the switching channel 119 and the driving channel 129, channels applied to other transistors included in the one pixel are illustrated. In FIGS. 8A to 11B described below, elements applied to the other transistors are illustrated. In the following description, a process of forming the storage capacitance Cst will be mainly described. In FIG. 7A, throughout the below-described processes, the storage capacitance Cst may be formed in an area referred to as C_st, and the second capacitance C2 may be formed in an area referred to as C_2. Also, as in FIG. 7A, throughout the below-described processes, the switching transistor Tsw may be formed in an area referred to as T_1, the sensing transistor Tsw2 may be formed in an area referred to as T_2, the emission transistor Tsw3 may be formed in an area referred to as T_3, and the driving transistor Tdr may be formed in an area referred to as T_4.

Subsequently, the switching channel 119 and the driving channel 129 may be covered by the gate insulation layer 103.

Figure 8A:
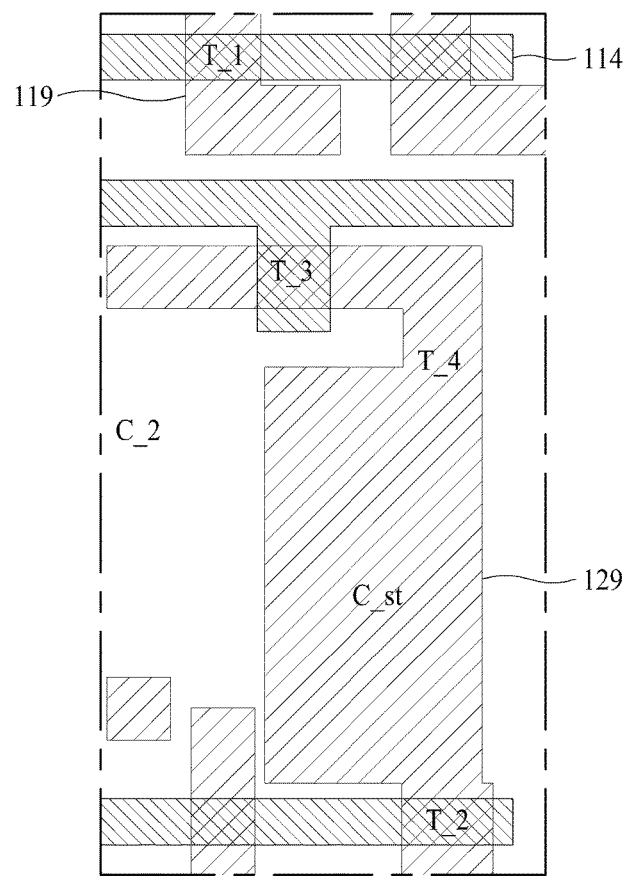
Figure 8B:
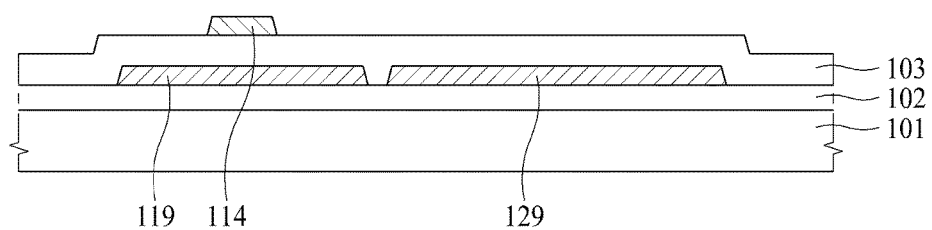

Subsequently, as illustrated in FIGS. 8A and 8B, by using a second mask, the switching gate 114 may be formed on the gate insulation layer 103 to overlap the switching active part 113 of the switching channel 119.

Figure 9A:
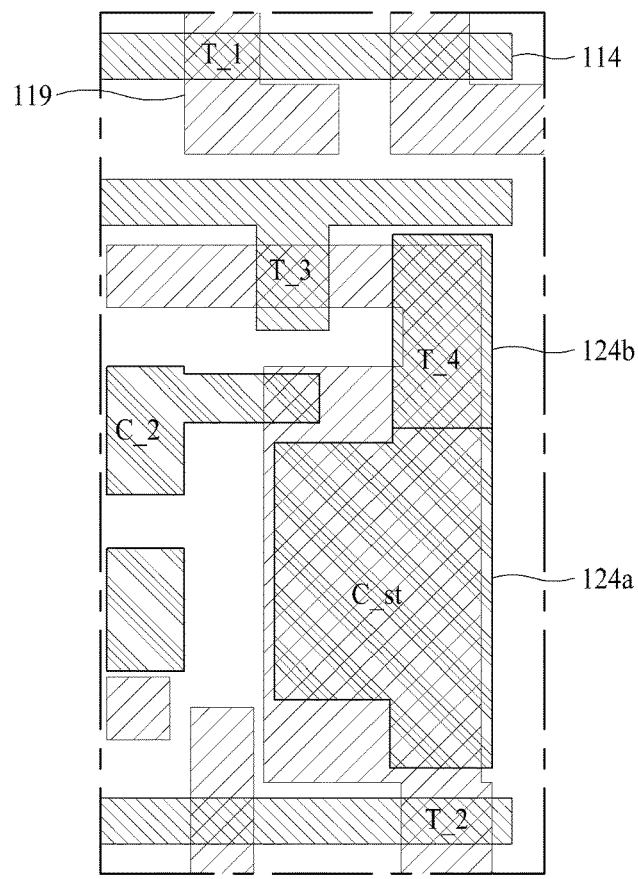
Figure 9B:
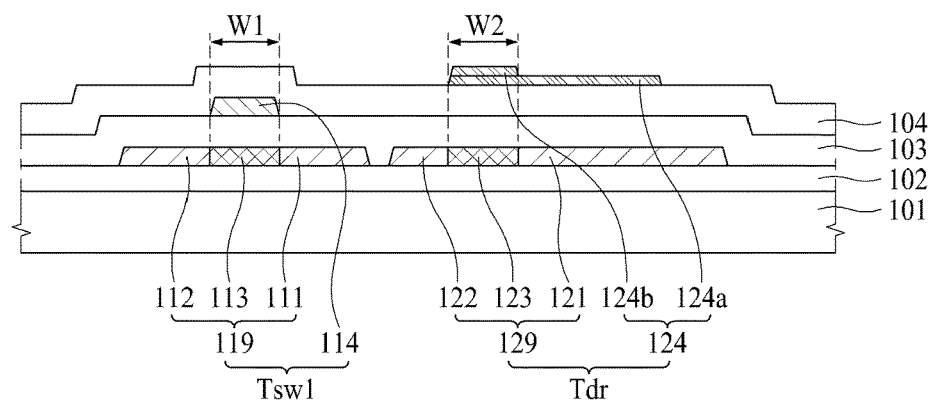

Subsequently, as illustrated in FIGS. 9A and 9B, the switching gate 114 and the gate insulation layer 103 may be covered by the first insulation layer 104.

Subsequently, by using a third mask, the driving gate 124 may be provided on the first insulation layer 104 to overlap the driving active part 123 of the driving channel 129.

In a case where the driving gate 124 includes the first gate electrode 124a and the second gate electrode 124b, the first gate electrode 124a may be provided on the first insulation layer 104, and the second gate electrode 124b may be provided on the first gate electrode 124a. The second gate electrode 124b may be disposed to overlap the driving active part 123. The first gate electrode 124a and the second gate electrode 124b may be simultaneously formed by using a halftone mask.

Subsequently, UV may be irradiated on a front surface of the substrate 101 having the second gate electrode 124b.

Therefore, as described above, carriers are increased in the areas, uncovered by the second gate electrode 124b, of the driving channel 129. Thus, the third conductor part 121 and the fourth conductor part 122 may be respectively provided in both ends of the driving channel 129. An area between the third conductor part 121 and the fourth conductor part 122 may be covered by the second gate electrode 124b, and thus, UV is not irradiated on the area. Accordingly, the area between the third conductor part 121 and the fourth conductor part 122 may correspond to the driving active part 123 having a characteristic of a semiconductor.

Moreover, carriers are increased in the areas, uncovered by the switching gate 114, of the switching channel 119. Thus, the first conductor part 111 and the second conductor part 112 may be respectively provided in both ends of the switching channel 119. An area between the first conductor part 111 and the second conductor part 112 may be covered by the switching channel 119, and thus, UV is not irradiated on the area. Accordingly, the area between the first conductor part 111 and the second conductor part 112 may correspond to the switching active part 113 having a characteristic of a semiconductor.

A width W1 of the switching active part 113, as illustrated in FIGS. 9A and 9B, may be the same as a width W1 of the switching gate 123. Also, a width W2 of the driving active part 123 may be the same as a width W2 of the second gate electrode 124b.

Figure 10A:
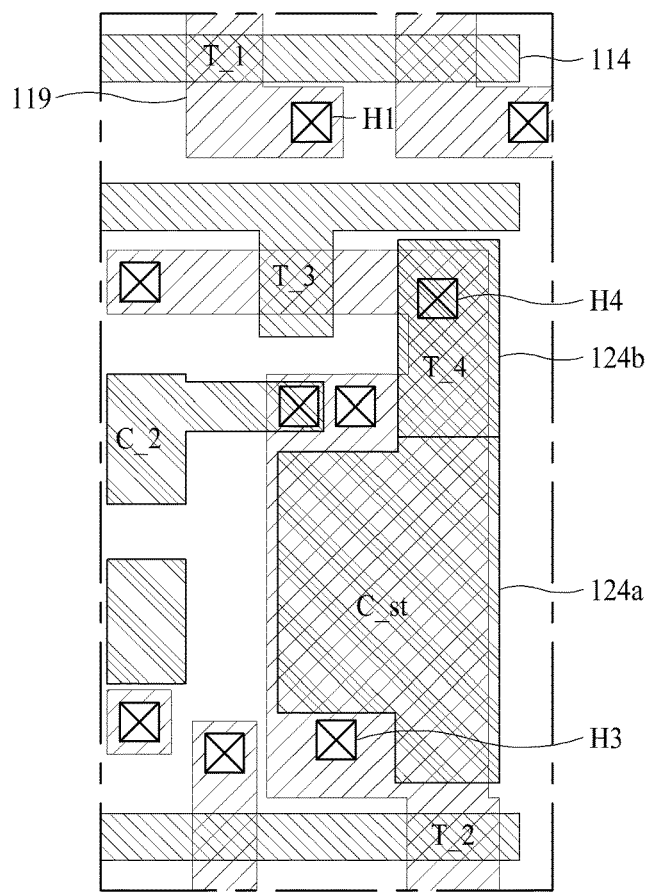
Figure 10B:
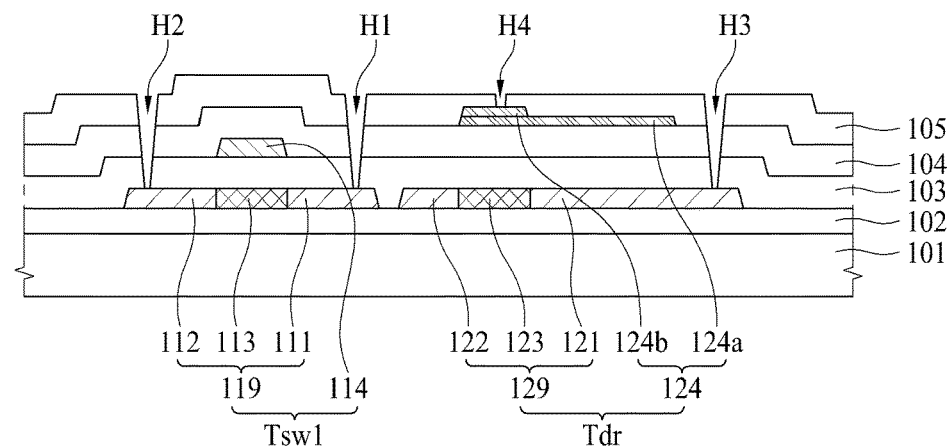

Subsequently, as illustrated in FIGS. 10A and 10B, the driving gate 124 and the first insulation layer 104 may be covered by the second insulation layer 105.

Subsequently, as illustrated in FIGS. 10A and 10B, by using a fourth mask, a plurality of contact holes may be formed. The plurality of contact holes may include a first contact hole H1 exposing the first conductor part 111 constituting the switching channel 119, a second contact hole H2 exposing a portion of the second conductor part 112 constituting the switching channel 119, a third contact hole H3 exposing a portion of the third conductor part 121 constituting the driving channel 129, and a fourth contact hole H4 exposing the second gate electrode 124b.

Figure 11A:
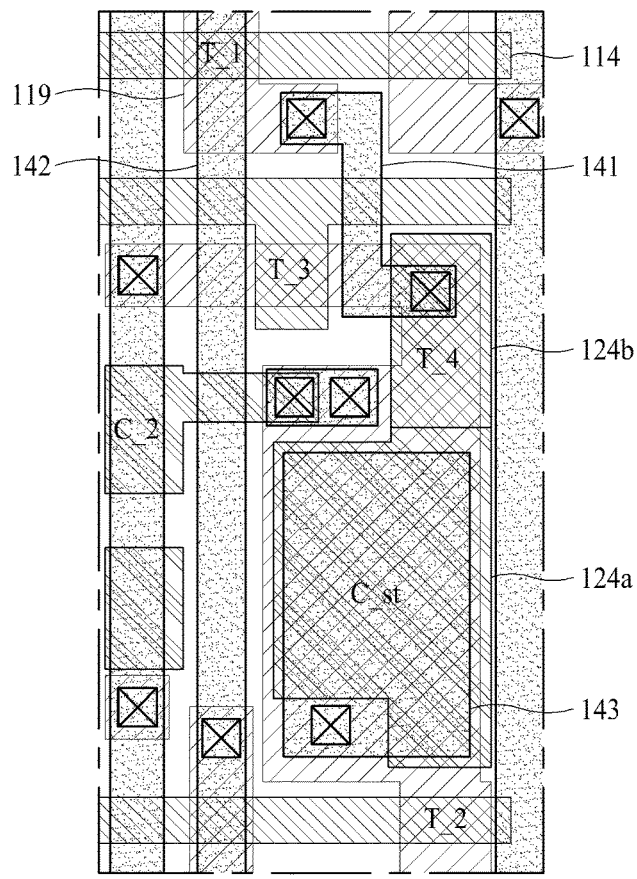
Figure 11B:
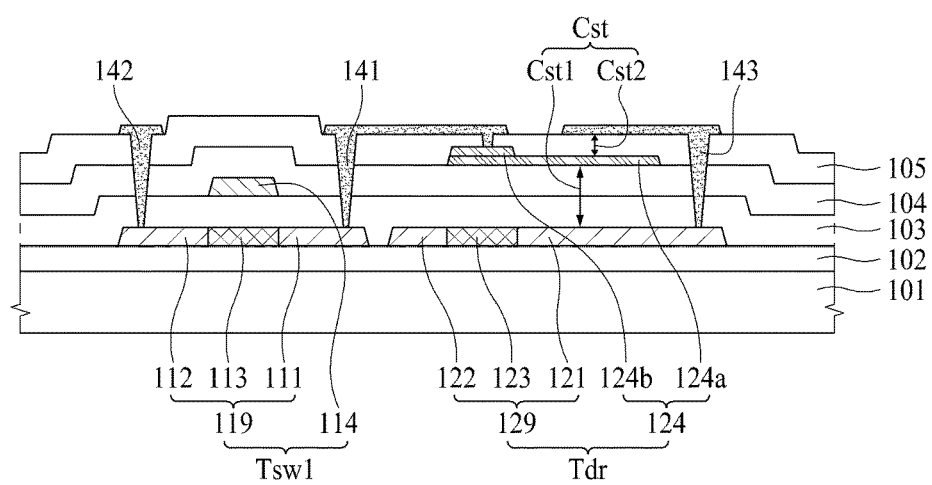

Subsequently, as illustrated in FIGS. 11A and 11B, by using a fifth mask, the first electrode 141, the second electrode 142, and the third electrode 143 may be formed.

Therefore, the switching transistor Tsw1 and the driving transistor Tdr may be formed.

Moreover, the storage capacitance Cst may be formed between the third conductor part 121 of the driving channel 129 and the first gate electrode 124a and between the third electrode 143 and the first gate electrode 124a.

Subsequently, the first electrode 141, the second electrode 142, the third electrode 143 and the second insulation layer 105 may be covered by the passivation layer 106.

Finally, the organic light emitting diode OLED may be formed on the passivation layer 106. The anode 131 may be connected to the third conductor part 121 configuring the driving channel 129 through a contact hole passing through the passivation layer 106.

Figure 12:
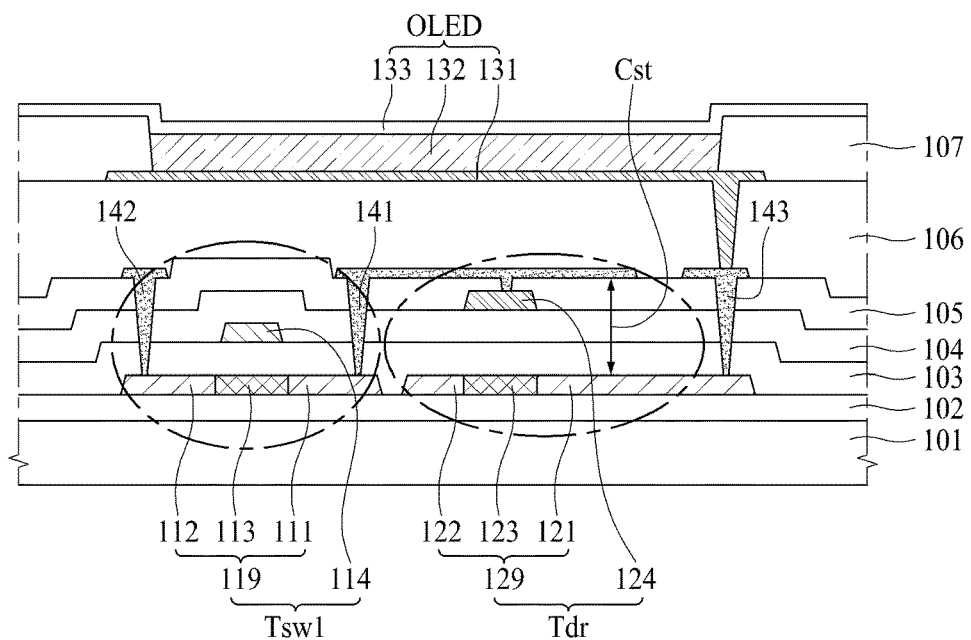
FIG. 12 is another exemplary diagram illustrating a cross-sectional view of a pixel of an organic light emitting display panel according to an aspect of the present disclosure.

FIG. 12 is another exemplary diagram illustrating a cross-sectional view of a pixel of an organic light emitting display panel 100 according to an aspect of the present disclosure. In the following description, details which are the same as or similar to the details described above with reference to FIGS. 4 to 11B are omitted or will be briefly described.

As described above with reference to FIG. 6, the organic light emitting display panel 100 according to an aspect of the present disclosure, as illustrated in FIG. 6, may include the substrate 101, the switching channel 119, the driving channel 129, the gate insulation layer 103, the switching gate 114, the first insulation layer 104, the driving gate 124, the second insulation layer 105, the first electrode 141, the second electrode 142, the third electrode 143, the passivation layer 106, and the organic light emitting diode OLED. The organic light emitting display panel 100 according to an aspect of the present disclosure illustrated in FIG. 12 may include a substrate 101, a switching channel 119, a driving channel 129, a gate insulation layer 103, a switching gate 114, a first insulation layer 104, a driving gate 124, a second insulation layer 105, a first electrode 141, a second electrode 142, a third electrode 143, a passivation layer 106, and an organic light emitting diode OLED.

Particularly, in the organic light emitting display panel 100 illustrated in FIG. 12, the first electrode 141 may be disposed to overlap the third conductor part 121 of the driving channel 129.

In this case, the driving gate 124 constituting a driving transistor Tdr may include only the second gate electrode 124b without the first gate electrode 124a (shown in FIG. 6).

The storage capacitance Cst may be provided by the first electrode 141, disposed to overlap the third conductor part 121 of the driving channel 129, and the third conductor part 121 of the driving channel 129.

More specifically, in the organic light emitting display panel according to an aspect of the present disclosure illustrated in FIG. 6, the first storage capacitance Cst1 may be provided by the third conductor part 121 of the driving channel 129 and the first gate electrode 124a disposed to overlap the third conductor part 121 of the driving channel 129, and additionally, the second storage capacitance Cst2 may be provided by the first gate electrode 124a and the third electrode 143 disposed to overlap the first gate electrode 124a.

On the other hand, in the organic light emitting display panel according to an aspect of the present disclosure illustrated in FIG. 12, the storage capacitance Cst may be provided by the first electrode 141, disposed to overlap the third conductor part 121 of the driving channel 129, and the third conductor part 121 of the driving channel 129.

In the present aspect, an oxide semiconductor may become conductive by using UV irradiation, and thus, a process of etching the gate insulation layer 103 may be omitted. Accordingly, various defects occurring in the process of etching the gate insulation layer 103 can be prevented.

In the present aspect, a sufficient storage capacitance can be secured, and thus, a metal layer for forming the storage capacitance may not be needed. Accordingly, the number of masks can be reduced.

In the present aspect, the gate insulation layer 103 has a sufficient thickness, and the storage capacitance necessary for driving of the driving transistor is secured. Accordingly, a characteristic between the current Ids and the gate-source voltage Vgs of the driving transistor can be improved.

In the present aspect, a length of a channel of the driving transistor Tdr (particularly, a length of the driving active part 123) is reduced, and thus, a whole area of the driving transistor is reduced and an ability to drive a current is improved.

According to the present aspect, since the first to fourth conductor parts 111, 112, 121, and 122 are formed even without etching the gate insulation layer 103, a defect caused by inflow of particles can be reduced, and a defect caused by a step height occurring in etching the gate insulation layer 103 can be reduced.

Hereinafter, a method of forming the first and third conductor parts 111 and 121 and the second and fourth conductor parts 112 and 122 in the switching channel 119 and the driving channel 129 without etching the gate insulation layer 103 and a structure and characteristic of each of the switching transistor Tsw1 and the driving transistor Tdr will be described. However, a below-described transistor (i.e., a coplanar oxide TFT) may be applied to all transistors included in the organic light emitting display panel according to the present aspect, in addition to the switching transistor Tsw1 and the driving transistor Tdr. Therefore, a coplanar oxide TFT applied to the present disclosure will be described by using reference numerals different from the above-described reference numerals.

Figure 13:
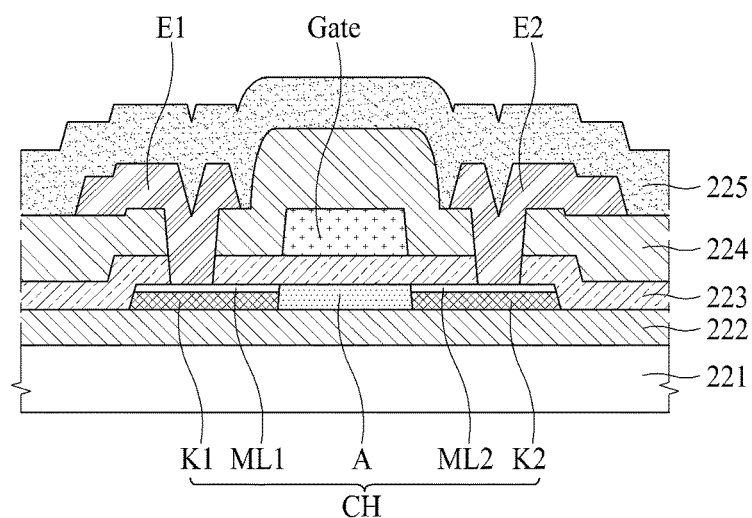
FIG. 13 is a cross-sectional view of a coplanar oxide TFT applied to an organic light emitting display panel according to an aspect of the present disclosure.

FIG. 13 is a cross-sectional view of a coplanar oxide TFT applied to an organic light emitting display panel according to an aspect of the present disclosure.

As described above, in order to manufacture the related art coplanar oxide TFT, the gate insulation layer should be etched through the dry etching process, and for this reason, various kinds of defects can occur due to the dry etching process.

In order to solve the problems, the present disclosure provides a coplanar oxide TFT in which a first conductor part and a second conductor part are provided in ends of a channel including oxide, electrically connected to a first electrode and a second electrode, and covered by a gate insulation layer.

In the coplanar oxide TFT applied to the present disclosure, the gate insulation layer is not etched. The coplanar oxide TFT applied to the present disclosure is manufactured through a process of applying UV "185 nm+254 nm" and heat "150° C." to ends of a channel covered by the gate insulation layer to make the ends of the channel conductive.

More specifically, in an aspect of the present disclosure, a process of etching the gate insulation layer is omitted, and the ends of the channel including oxide become conductive by using an optical chemical method, thereby manufacturing the coplanar oxide TFT.

In an aspect of the present disclosure, since the process of etching the gate insulation layer is omitted, a process is simplified, and since there is no step height of the gate insulation layer, an error rate can be reduced in subsequent processes.

The organic light emitting display device according to an aspect of the present disclosure, as described above, may include the organic light emitting display panel, and at least one coplanar oxide TFT illustrated in FIG. 13 may be included in each of the pixels provided in a display area of the organic light emitting display panel.

The oxide TFT, as illustrated in FIG. 13, may include a channel CH provided on an upper end of a buffer 222 deposited on a substrate 221, a gate insulation layer 223 covering the channel CH and the buffer 222, a gate Gate provided on an upper end of the gate insulation layer 223 to overlap a portion of the channel CH, and an insulation layer 224 covering the gate Gate and the gate insulation layer 223. In this case, a resistance of an area, overlapping the gate Gate, of the channel CH may differ from a resistance other than the overlapping area. As illustrated in FIG. 13, a TFT having a structure where the gate Gate is disposed on an upper end of the channel CH may be referred to as a coplanar TFT.

First, the buffer 222 may be disposed on an upper end of the substrate 221. The buffer 222 may be formed of an organic material or an inorganic material, or may be formed by a combination of an organic material and an inorganic material. The buffer 222 may include at least one layer. For example, the buffer 222 may include $SiO_2$, and a thickness of the buffer 222 may be 100 nm to 1 µm.

In an aspect of the present disclosure, since the gate insulation layer 223 is not etched, the buffer 222 is not damaged.

Since the buffer 222 is not damaged, a defect occurring in the subsequent process can be reduced.

Second, the channel CH may be formed of an oxide semiconductor. For example, the oxide semiconductor may be IGZO (InGaZnO) consisting of indium (In), gallium (Ga), zinc (Zn), and oxygen (O).

The channel CH may include an active part A including the oxide semiconductor, a first conductor part K1 which is provided in one end of the active part A and has a sheet resistance lower than that of the active part A, and a second conductor part K2 which is provided in the other end of the active part A and has a sheet resistance lower than that of the active part A.

The first conductor part K1 may be connected to a first electrode E1, and the second conductor part K2 may be connected to a second electrode E2.

The first conductor part K1 may include metal which is the same as metal constituting the oxide semiconductor, and the metal included in the first conductor part K1 may include a free electron and a vacancy formed where oxygen was removed. Also, the second conductor part K2 may include metal which is the same as metal constituting the oxide semiconductor, and the metal included in the second conductor part K2 may include a free electron and a vacancy from which oxygen has departed.

For example, when UV is irradiated on a compound including the metal constituting the oxide semiconductor and oxygen which are bonded to each other by a covalent bond, the covalent bond of the metal and the oxygen may be broken, and the oxygen may be separated from the metal, whereby a vacancy may be formed in the metal. Accordingly, the free electron may be generated in the metal.

An area where the free electron is generated due to exposure to UV may correspond to the first conductor part K1 and the second conductor part K2. Due to the free electron generated in each of the first conductor part K1 and the second conductor part K2, a mobility of each of the first conductor part K1 and the second conductor part K2 may have a value which is greater than that of a mobility of the active part A including the oxide semiconductor. Also, due to the free electron generated in each of the first conductor part K1 and the second conductor part K2, a resistance of each of the first conductor part K1 and the second conductor part K2 may have a value which is less than that of a resistance of the active part A including the oxide semiconductor.

Therefore, the first conductor part K1 and the second conductor part K2 may have a characteristic of a conductor. As described above, the first conductor part K1 may be electrically connected to the first electrode E1, and the second conductor part K2 may be electrically connected to the second electrode E2.

Third, a first metal layer ML1 which is formed by bonding the same metal as the metal constituting the oxide semiconductor to an Off group transferred from the gate insulation layer 223 may be provided in a boundary area between the first conductor part K1 and the gate insulation layer 223. Also, a second metal layer ML2 which is formed by bonding the same metal as the metal constituting the oxide semiconductor to an Off group transferred from the gate insulation layer 223 may be provided in a boundary area between the second conductor part K2 and the gate insulation layer 223.

Fourth, the gate insulation layer 223 may include $SiO_2$. In the driving transistor Tdr applied to the present disclosure, the first insulation layer 104 may be further provided on the gate insulation layer 223. Hereinafter, a coplanar oxide TFT will be described with reference to the switching transistor Tsw1. The gate Gate may be provided on an upper end of the gate insulation layer 223. The gate Gate may overlap the active part A including the oxide semiconductor in the channel CH.

In this case, the first conductor part K1 and the second conductor part K2 may not vertically overlap the gate Gate.

For example, the gate insulation layer 223 may be provided on an upper end of the channel CH, and then, the gate Gate may be provided on an upper end of the gate insulation layer 223. Subsequently, when UV is irradiated on the gate Gate and the gate insulation layer 223, as described above, the UV may be irradiated on both ends of the active part A via the gate insulation layer 223 because the both ends of the active part A are not covered by the gate Gate including metal. Accordingly, the both ends of the active part A may become conductive, and thus, the first conductor part K1 and the second conductor part K2 may be provided.

Fifth, an insulation layer 224 covering the gate Gate and the gate insulation layer 223 may be provided on the upper end of each of the gate Gate and the gate insulation layer 223.

Sixth, the first electrode E1 provided on an upper end of the insulation layer 224 may be connected to the first conductor part K1 through a contact hole formed in the insulation layer 224 and the gate insulation layer 123, and the second electrode E2 may be connected to the second conductor part K2 through another contact hole formed in the insulation layer 224 and the gate insulation layer 223.

Seventh, the insulation layer 224, the first electrode E1, and the second electrode E2 may be covered by a passivation layer 225.

FIGS. 14 to 17 illustrate a method of manufacturing a coplanar oxide TFT applied to an organic light emitting display panel according to an aspect of the present disclosure. In the following description, details which are the same as or similar to the details described above with reference to FIG. 13 are omitted or will be briefly described.

Figure 14:
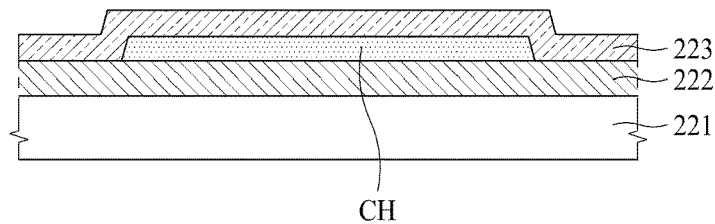
FIGS. 14 to 17 illustrate a method of manufacturing a coplanar oxide TFT applied to an organic light emitting display panel according to an aspect of the present disclosure.

First, as illustrated in FIG. 14, the buffer 222, the channel CH, and the gate insulation layer 223 may be sequentially stacked on the substrate 221.

The entire area of the channel CH may be formed of an oxide semiconductor such as IGZO.

Figure 15:
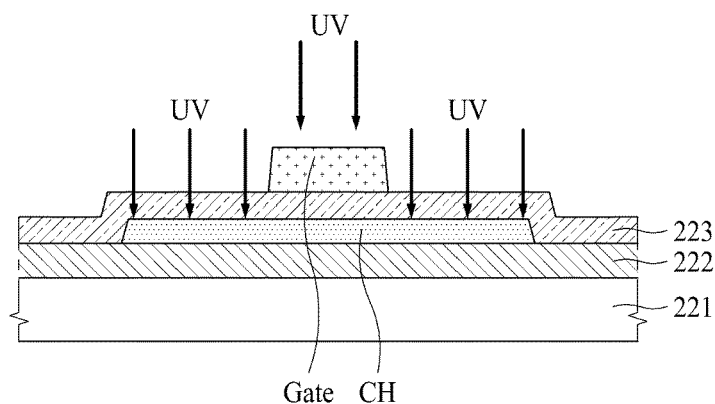

Subsequently, as illustrated in FIG. 15, the gate Gate may be coated on an area corresponding to the channel CH. In this case, the gate Gate may cover only a center portion of the channel CH instead of the entire portion of the channel CH. Therefore, both ends of the channel CH are exposed and may not overlap the gate Gate.

After the gate Gate is provided, UV may be irradiated on the gate Gate and the gate insulation layer 223. In this case, as illustrated in FIG. 15, the UV may be irradiated on the upper end of each of the gate Gate and the gate insulation layer 223.

However, the UV may be irradiated from a portion under the substrate 221. In this case, a metal layer LS may be provided on a lower end of the channel CH and in an area corresponding to the active part A. The metal LS may be provided between the channel CH and the substrate 221 and may be covered by the buffer 222. For example, in a case where the metal LS is formed less than the channel CH, particularly, in a case where the metal LS is formed to have a size similar to that of the gate Gate, when the UV is irradiated from the portion under the substrate 221, an area of the channel CH uncovered by the metal LS may become conductive, and thus, the first conductor part K1 and the second conductor part K2 may be provided.

The UV may include UV having a wavelength of 185 nm and UV having a wavelength of 254 nm. The oxide semiconductor may become conductive due to the UV irradiation, and thus, the first conductor part K1 and the second conductor part K2 may be provided.

A wavelength of the UV may be within a range of 100 nm to 400 nm.

Figure 16:
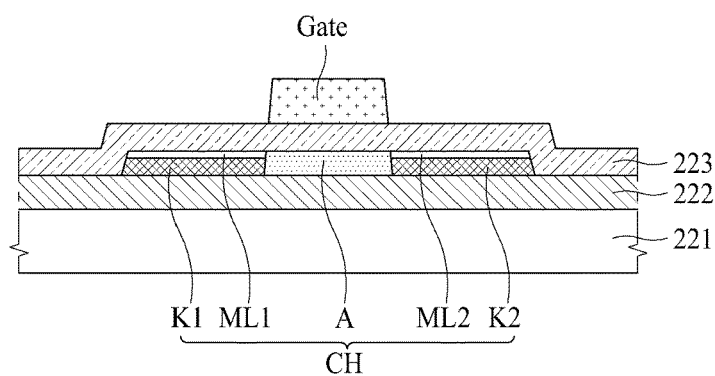

In this case, when heat of about 100° C. to 200° C. is applied along with the UV or after the UV is irradiated, as illustrated in FIG. 16, the first metal layer ML1 and the second metal layer ML2 may be formed in a boundary area, which is adjacent to the gate insulation layer 223, of the first conductor part K1 and the second conductor part K2.

Figure 17:
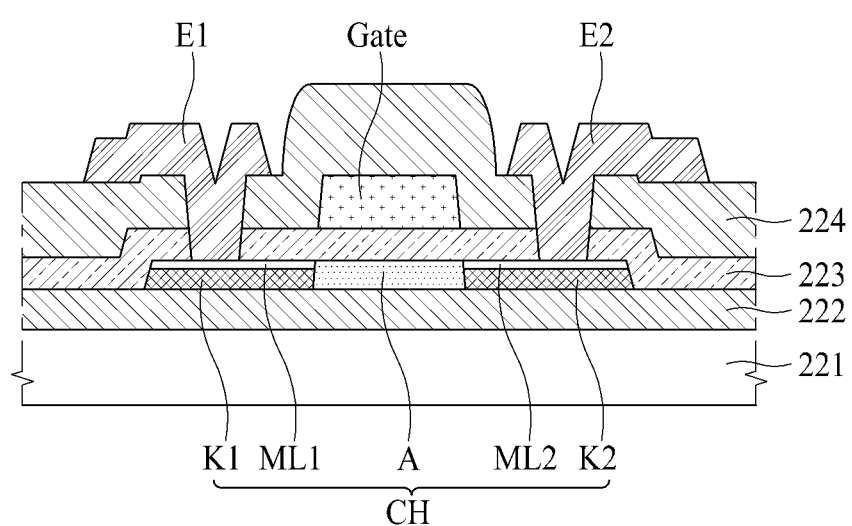

Subsequently, as illustrated in FIG. 17, after the first conductor part K1 and the second conductor part K2 are formed, the insulation layer 224 may cover the gate insulation layer 223 and the gate Gate.

The first electrode E1 provided on an upper end of the insulation layer 224 may be connected to the first conductor part K1 through a contact hole formed in the gate insulation layer 223 and the insulation layer 224, and the second electrode E2 provided on the upper end of the insulation layer 224 may be connected to the second conductor part K2 through another contact hole formed in the gate insulation layer 223 and the insulation layer 224.

Finally, as illustrated in FIG. 13, the passivation layer 225 may cover the first electrode E1, the second electrode E2, and the insulation layer 224.

Figure 18:
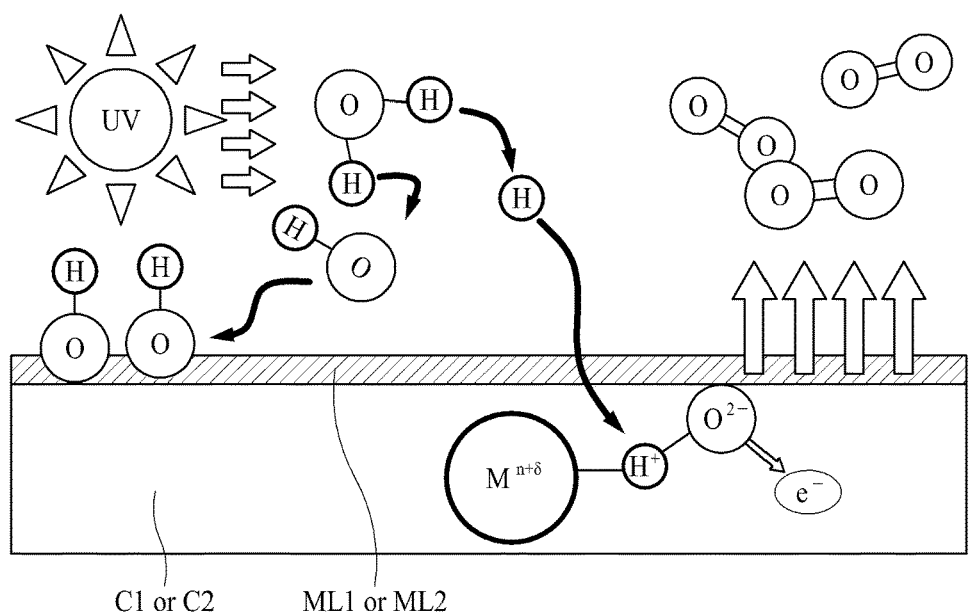
FIG. 18 illustrates a method of forming first and second conductor parts of a coplanar oxide TFT applied to an organic light emitting display panel according to an aspect of the present disclosure.

FIG. 18 is an exemplary diagram illustrating a method of forming first and second conductor parts of a coplanar oxide TFT applied to an organic light emitting display panel according to an aspect of the present disclosure.

As described above, when UV is irradiated on the channel CH including an oxide semiconductor such as IGZO, a bond between a metal M constituting the oxide semiconductor and oxygen ($O^{2-}$) may be broken, and thus, the oxygen ($O^{2-}$) may be separated from the metal M. In this case, a vacancy formed where the oxygen was removed may be formed in the metal M, and thus, free electrons may be generated. Therefore, the first and second conductor parts K1 and K2 where the free electrons are generated may be respectively formed in both ends of the channel CH. To provide an additional description, carriers may be generated in an area, on which UV is irradiated, of the oxide semiconductor, and thus, a resistance is rapidly reduced in the area, whereby the area may have a characteristic of a conductor.

Oxygens ($O^{2-}$) separated from the metal M may be bonded to one another to generate oxygen molecules, and the oxygen molecules may be trapped in the gate insulation layer 223, or may be discharged to the outside through the gate insulation layer 223.

When UV is irradiated on the channel CH, water ($H_2O$) remaining in the gate insulation layer 223 or water ($H_2O$) remaining in air may be photo-decomposed into a ft group and an $OH^-$ group by the UV.

The metal M from which the oxygen ($O^{2-}$) has departed may be bonded to the $OH^-$ group to form the first metal layer ML1 in a boundary area between the first conductor part K1 and the gate insulation layer 223, and the metal M from which the oxygen ($O^{2-}$) has departed may be bonded to the Off group to form the second metal layer ML2 in a boundary area between the second conductor part K2 and the gate insulation layer 223.

Due to the first metal layer ML1 and the free electrons, a mobility of the first conductor part K1 increases, and thus, a resistance decreases. Due to the second metal layer ML2 and the free electrons, a mobility of the second conductor part K2 increases, and thus, a resistance decreases.

In the related art, in order to change an oxide semiconductor to a conductor, oxygens are physically separated through dry etching and plasma.

However, in an aspect of the present disclosure, when an oxide semiconductor (for example, IGZO) is changed to $IGZO_{-1-x}$ and thus an oxygen vacancy is formed, the oxide semiconductor may be changed to a conductor.

To this end, in an aspect of the present disclosure, oxygens are physically separated by using UV instead of dry etching and plasma.

For example, an oxygen defect occurs in a metal oxide semiconductor such as $IGZO_4$ due to UV, and thus, the metal oxide semiconductor is changed to $IGZO_{-4-x}$, whereby an oxygen vacancy supplies electrons. In this case, the oxygen vacancy is bonded to an Off group to form an MOH bond, and thus, the oxygen vacancy is not again bonded to oxygen.

If delta E between a conduction band and a valance band is converted into a wavelength band, delta E is about 250λ (lambda). Due to a dangling bond state between the conduction band and the valance band, when UV having a wavelength of 400λ or less is irradiated, oxygens are separated, and thus, an oxygen vacancy is formed. Accordingly, the UV may have a wavelength of 100λ to 400λ.

Figure 19:
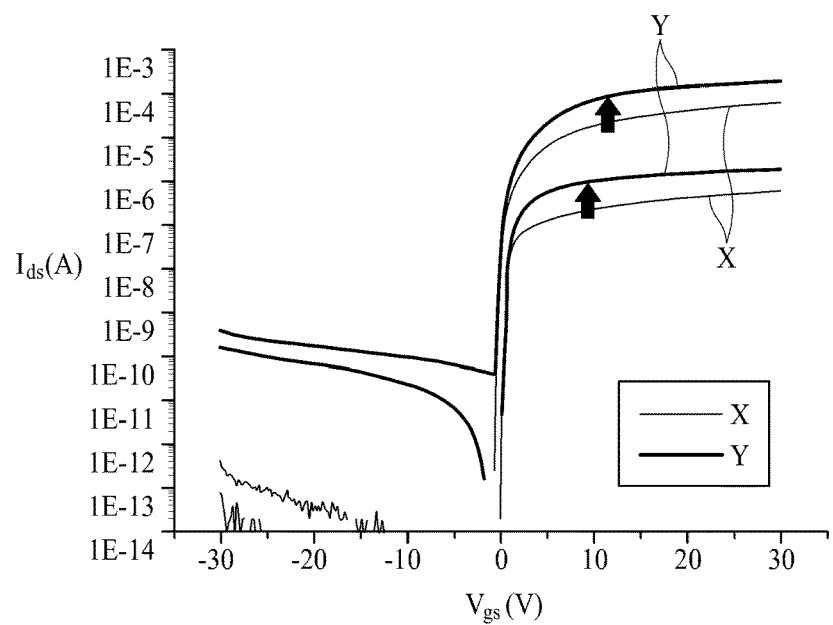
FIG. 19 is a graph showing a result obtained by comparing a device characteristic of a coplanar oxide TFT applied to an organic light emitting display panel according to an aspect of the present disclosure and a device characteristic of a coplanar oxide TFT, having a structure similar to the present disclosure without ultraviolet (UV) irradiation.

FIG. 19 is a graph showing a result obtained by comparing a device characteristic of a coplanar oxide TFT applied to an organic light emitting display panel according to an aspect of the present disclosure and a device characteristic of a coplanar oxide TFT, having a structure similar to the present disclosure, on which ultraviolet (UV) is not irradiated. In FIG. 19, reference numeral X represents a characteristic of an oxide TFT which has a structure where a gate insulation layer is not etched and on which UV treatment is not performed, similar to an oxide TFT applied to the present disclosure. Reference numeral Y represents a characteristic of an oxide TFT which has a structure illustrated in FIG. 13 and on which UV treatment has been performed, according to an aspect of the present disclosure.

A structure where a gate insulation layer is not etched is good in terms of a defect, but resistances of both ends of a channel increase excessively. Therefore, a current flowing from a first electrode E1 to the channel is obstructed by a very high resistance, and for this reason, the current can be cut off. Therefore, like the characteristic referred to as X in the graph, mobility is excessively lowered, and for this reason, it is difficult to use an oxide semiconductor for which UV treatment is not performed.

However, when UV treatment is performed as in the present disclosure, a resistance characteristic of each of the first and second conductor parts K1 and K2 is good shown as the characteristic referred to as Y in the graph. Accordingly, an on-current increases in an oxide TFT on which UV treatment has been performed.

In an aspect of the present disclosure, the gate Gate may be formed on the gate insulation layer 223 through a wet etching process, and then, UV "185 nm+254 nm" may be irradiated on the gate Gate and the gate insulation layer 223. In this case, heat of 100° C. to 200° C. (for example, heat of 150° C.) may be applied from a portion under the substrate 221.

Therefore, the both ends of the channel CH may become conductive, and thus, the first conductor part K1 and the second conductor part K2 may be provided.

As a simulation and test result, a mobility of the channel CH is about 4.5 cm$^2$/Vs before the both ends of the channel CH become conductive, and a current is cut off by a resistance of the channel CH. However, according to an aspect of the present disclosure, by irradiating UV, the both ends of the channel CH become conductive, and then, a mobility of each of the first and second conductor parts K1 and K2 is enhanced to 15 cm$^2$/Vs. Therefore, it can be seen that a device performance of the oxide TFT is enhanced by 300% or more. In this case, when heat is applied to the oxide TFT, a characteristic of each of the first and second conductor parts K1 and K2 can be more stabilized. Accordingly, an oxide TFT with more enhanced reliability can be manufactured.

For example, in FIG. 19, a graph referred to as X shows a relationship between a gate-source voltage Vgs and a drain-source current Ids in an oxide TFT which has a structure similar to the present disclosure and where UV is not irradiated on both ends of a channel, and a graph referred to as Y shows a relationship between a gate-source voltage Vgs and a drain-source current Ids in the oxide TFT according to an aspect of the present disclosure. Referring to FIG. 19, it can be seen that the drain-source current Ids in the oxide TFT according to an aspect of the present disclosure increases in comparison with the oxide TFT which has the structure similar to the present disclosure and where UV is not irradiated on the both ends of the channel.

Figure 20:
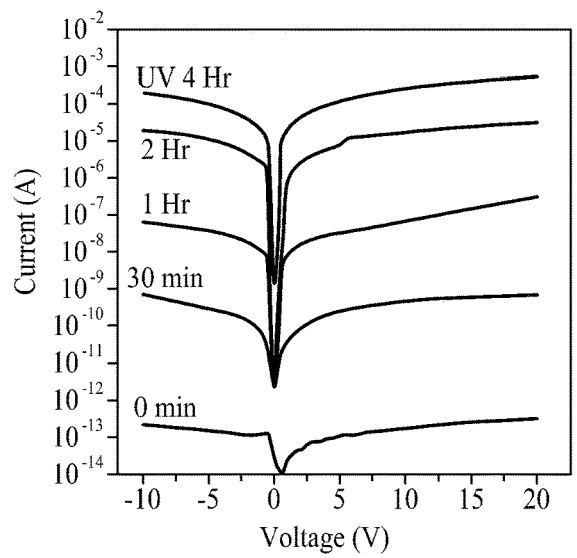
FIG. 20 is a graph showing a relationship between a current and a duration where UV is irradiated on a coplanar oxide TFT applied to an organic light emitting display panel according to an aspect of the present disclosure.
Figure 21:
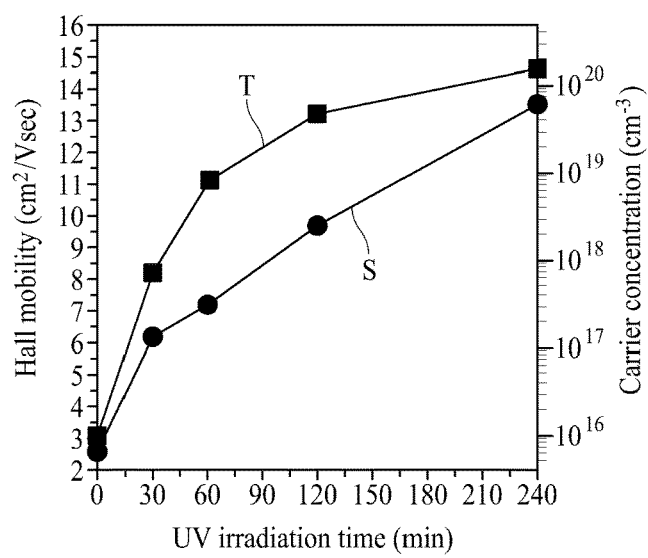
FIG. 21 is a graph showing a relationship between each of hall mobility and carrier concentration and a duration where UV is irradiated on a coplanar oxide TFT applied to an organic light emitting display panel according to an aspect of the present disclosure.

FIG. 20 is a graph showing a relationship between a current and a duration where UV is irradiated on a coplanar oxide TFT applied to an organic light emitting display panel according to an aspect of the present disclosure. FIG. 21 is a graph showing a relationship between each of hall mobility and carrier concentration and a duration where UV is irradiated on a coplanar oxide TFT applied to an organic light emitting display panel according to an aspect of the present disclosure.

First, referring to FIG. 20, as a duration where UV is irradiated increases, a current flowing in an oxide TFT increases.

Referring to FIG. 21, as a duration where UV is irradiated increases, a hall mobility and a carrier concentration of an oxide TFT according to an aspect of the present disclosure increase. In FIG. 21, a graph showing a hall mobility is referred to as T, and a graph showing a carrier concentration is referred to as S.

Therefore, it can be seen that by irradiating UV, carriers in the oxide semiconductor increase, and thus, a resistance is reduced.

The above-described features of the present disclosure will be briefly described below.

According to an aspect of the present disclosure, a resistance characteristic of an oxide semiconductor may be controlled by an optical chemical method without vacuum dry etch equipment (D/E).

Therefore, according to an aspect of the present disclosure, an advantage of the related art coplanar oxide TFT is used as-is, a process of manufacturing the coplanar oxide TFT, a device characteristic of the coplanar oxide TFT is improved, and a defect issue is reduced.

For example, in the related art, short circuit occurs between a gate and a drain due to particles which occur when etching a gate insulation layer. On the other hand, according to an aspect of the present disclosure, since the gate insulation layer is not etched, a possibility that short circuit occurs between the gate and the drain is reduced.

Moreover, in an aspect of the present disclosure, the gate insulation layer is not etched, thereby solving a problem where short circuit occurs between lines because a buffer is etched when etching the gate insulation layer.

The related art coplanar oxide TFT is manufactured through a process of etching the gate insulation layer and then making ends of a channel including oxide conductive by using plasma.

On the other hand, in an aspect of the present disclosure, the gate insulation layer is not etched. The coplanar oxide TFT applied to the present disclosure is manufactured through a process of applying UV "185 nm+254 nm" and heat "150° C." to ends of a channel covered by the gate insulation layer to make the ends of the channel conductive.

To provide an additional description, in an aspect of the present disclosure, a process of etching the gate insulation layer is omitted, and the ends of the channel including oxide (IGZO) become conductive by using the optical chemical method, thereby manufacturing the coplanar oxide TFT.

Moreover, in an aspect of the present disclosure, since the process of etching the gate insulation layer is omitted, a process is simplified, and since there is no step height of the gate insulation layer, an error rate decreases in a subsequent process.

As described above, according to the aspects of the present disclosure, the first and second conductor parts included in the channel covered by the insulation layer may become conductive due to UV, and metal for generating a capacitance may be omitted, thereby reducing the number of masks.

Moreover, according to the aspects of the present disclosure, the thickness of the gate insulation layer configuring the switching transistor may differ from the thickness of the gate insulation layer configuring the driving transistor.

Accordingly, the characteristic of the switching transistor is enhanced by reducing the thickness of the gate insulation layer configuring the switching transistor, and the characteristic between the current Ids and the gate-source voltage Vgs of the driving transistor is enhanced by increasing the thickness of the gate insulation layer configuring the driving transistor.

Moreover, according to the aspects of the present disclosure, the gate insulation layer of the switching transistor and the gate insulation layer of the driving transistor may be formed to have different thicknesses. Therefore, the low resistance characteristic of the switching transistor is secured. Also, since the thickness of the gate insulation layer of the driving transistor increases, a voltage driving width or a current driving width increases.

Moreover, according to the aspects of the present disclosure, since the first conductor part and the second conductor part are formed even without etching the insulation layer, a defect caused by inflow of particles is reduced, and a defect caused by a step height occurring in etching the insulation layer is reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A transistor substrate comprising:
    a substrate;
    a switching channel on the substrate;
    a driving channel on the substrate;
    a gate insulation layer covering the switching channel and the driving channel;
    a switching gate on the gate insulation layer and overlapping a switching active part which includes an oxide semiconductor and constitutes the switching channel;
    a first insulation layer covering the switching gate and the gate insulation layer;
    a driving gate on the first insulation layer and overlapping a driving active part which includes an oxide semiconductor and constitutes the driving channel;
    a second insulation layer covering the driving gate and the first insulation layer;
    a first electrode on the second insulation layer and connected to a first conductor part constituting the switching channel and the driving gate; and
    a second electrode on the second insulation layer and connected to a second conductor part constituting the switching channel.

2. The transistor substrate of claim 1, wherein the driving gate comprises:
    a first gate electrode on the first insulation layer and overlapping a third conductor part constituting the driving channel, the first gate electrode including a transparent conductive material; and
    a second gate electrode connected to the first electrode, disposed on the first gate electrode and overlapping the driving active part.

3. The transistor substrate of claim 2, wherein the first gate electrode comprises a first area overlapping the second gate electrode and a second area overlapping the third conductor part.

4. The transistor substrate of claim 2, wherein the first gate electrode contacts the second gate electrode.

5. The transistor substrate of claim 2, wherein the driving active part has a width the same as a width of the second gate electrode.

6. The transistor substrate of claim 2, further comprising a first storage capacitance between the third conductor part of the driving channel and the first gate electrode.

7. The transistor substrate of claim 1, wherein the switching active part has a width the same as a width of the switching gate.

8. The transistor substrate of claim 1, wherein the gate insulation layer is disposed on the substrate and covers the switching channel and the driving channel.

9. The transistor substrate of claim 2, further comprising a third electrode connected to the third conductor part of the driving channel, disposed on the second insulation layer and overlapping the first gate electrode.

10. The transistor substrate of claim 1, wherein the switching channel and the driving channel are disposed on the same layer.

11. An organic light emitting display panel comprising:
    a substrate;
    a switching channel on the substrate;
    a driving channel on the substrate;
    a gate insulation layer covering the switching channel and the driving channel;
    a switching gate on the gate insulation layer and overlapping a switching active part which includes an oxide semiconductor and constitutes the switching channel;
    a first insulation layer covering the switching gate and the gate insulation layer;
    a driving gate on the first insulation layer and overlapping a driving active part which includes an oxide semiconductor and constitutes the driving channel;
    a second insulation layer covering the driving gate and the first insulation layer;
    a first electrode on the second insulation layer and connected to the driving gate and the switching channel through a first conductor part;
    a second electrode on the second insulation layer and connected to the switching channel through a second conductor part;
    a passivation layer covering the first electrode, the second electrode, and the second insulation layer; and
    an organic light emitting diode (OLED) disposed on the passivation layer having an anode connected to the third conductor part of the driving channel.

12. The organic light emitting display panel of claim 11, wherein the driving gate comprises:
    a first gate electrode on the first insulation layer and overlapping a third conductor part of the driving channel, the first gate electrode including a transparent conductive material; and
    a second gate electrode connected to the first electrode, disposed on the first gate electrode and overlapping the driving active part.

13. The transistor substrate of claim 12, wherein the first gate electrode comprises a first area overlapping the second gate electrode and a second area overlapping the third conductor part.

14. The transistor substrate of claim 12, wherein the first gate electrode contacts the second gate electrode.

15. The transistor substrate of claim 12, wherein the driving active part has a width the same as a width of the second gate electrode.

16. The transistor substrate of claim 11, further comprising a first storage capacitance between the third conductor part of the driving channel and the first gate electrode.

17. The transistor substrate of claim 11, wherein the switching active part has a width the same as a width of the switching gate.

18. The transistor substrate of claim 11, wherein the gate insulation layer is disposed on the substrate and covers the switching channel and the driving channel.

19. The transistor substrate of claim 11, wherein the switching channel and the driving channel are disposed on the same layer.

20. The organic light emitting display panel of claim 11, further comprising a third electrode connected to the driving channel through a third conductor part and disposed on the second insulation layer, wherein the third electrode is connected to the anode, and the third electrode overlaps the third conductor part of the driving channel.

* * * * *